(12) United States Patent
Hamaguchi et al.

(10) Patent No.: US 8,319,899 B2
(45) Date of Patent: Nov. 27, 2012

(54) FRONT-END CIRCUIT, TUNER, AND TELEVISION BROADCASTING RECEIVER

(75) Inventors: Mutsumi Hamaguchi, Osaka (JP); Tsuyoshi Itaya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 260 days.

(21) Appl. No.: 12/822,819

(22) Filed: Jun. 24, 2010

(65) Prior Publication Data

US 2011/0051013 A1    Mar. 3, 2011

(30) Foreign Application Priority Data

Sep. 1, 2009   (JP) ................................. 2009-201580

(51) Int. Cl.
*H04N 5/44*    (2011.01)
(52) U.S. Cl. ....................................................... 348/725
(58) Field of Classification Search .................. 348/731, 348/725, 726, 732, 735, 727–729
See application file for complete search history.

(56) References Cited

U.S. PATENT DOCUMENTS

| | | | | | |
|---|---|---|---|---|---|
| 4,620,224 | A | * | 10/1986 | Lee et al. ....................... | 380/214 |
| 5,440,587 | A | * | 8/1995 | Ishikawa et al. ............... | 375/332 |
| 5,737,035 | A | * | 4/1998 | Rotzoll .......................... | 348/725 |
| 6,498,929 | B1 | | 12/2002 | Tsurumi et al. | |
| 6,985,432 | B1 | * | 1/2006 | Hadad ............................ | 370/203 |
| 7,508,451 | B2 | * | 3/2009 | Sheng et al. ................... | 348/507 |
| 8,077,262 | B2 | * | 12/2011 | Yun et al. ....................... | 348/725 |
| 2003/0174079 | A1 | | 9/2003 | Soltanian et al. | |
| 2005/0243217 | A1 | | 11/2005 | Yun et al. | |
| 2005/0243218 | A1 | * | 11/2005 | Yee et al. ....................... | 348/725 |
| 2005/0243219 | A1 | | 11/2005 | Yun et al. | |
| 2005/0243220 | A1 | | 11/2005 | Yun et al. | |
| 2006/0017856 | A1 | | 1/2006 | Sheng et al. | |
| 2008/0158433 | A1 | | 7/2008 | Yun et al. | |
| 2008/0297664 | A1 | | 12/2008 | Yun et al. | |
| 2009/0156135 | A1 | | 6/2009 | Kamizuma et al. | |
| 2009/0185079 | A1 | | 7/2009 | Yun et al. | |
| 2010/0022211 | A1 | * | 1/2010 | Huang ........................ | 455/232.1 |
| 2010/0061485 | A1 | * | 3/2010 | Clark et al. ................... | 375/319 |
| 2010/0225820 | A1 | * | 9/2010 | Yun et al. ...................... | 348/607 |
| 2010/0321590 | A1 | * | 12/2010 | Satoda et al. ................. | 348/731 |
| 2012/0069876 | A1 | * | 3/2012 | Kamizuma et al. ........... | 375/219 |

FOREIGN PATENT DOCUMENTS

| | | |
|---|---|---|
| CN | 1973431 A | 5/2007 |
| GB | 2 424 326 A | 9/2006 |
| JP | 5-56363 A | 3/1993 |
| JP | 6-326894 A | 11/1994 |

(Continued)

*Primary Examiner* — Paulos Natnael
(74) *Attorney, Agent, or Firm* — Birch, Stewart, Kolasch & Birch, LLP

(57) ABSTRACT

A front-end circuit according to the present invention includes a VCO which oscillates a local signal, a mixer which converts an RF signal Frf into a baseband signal, a DC offset cancel circuit which detects a DC offset contained in the baseband signal and then eliminates the DC offset, and a local frequency control circuit which controls a frequency of the local signal. In a case where the RF signal is an analog television signal, the local frequency control circuit controls the frequency of the local signal so that a frequency of the baseband signal differs from each frequency spectrum of a luminance signal contained in a video signal which is generated by demodulating the baseband signal. This makes it possible to provide the front-end circuit which can prevent video distortion caused when a frequency spectrum is eliminated from the luminance signal.

18 Claims, 8 Drawing Sheets

FOREIGN PATENT DOCUMENTS

| | | |
|---|---|---|
| JP | 7-254865 A | 10/1995 |
| JP | 10-93647 A | 4/1998 |
| JP | 2003-273945 A | 9/2003 |
| JP | 2003-276945 A | 10/2003 |
| JP | 2006-42054 A | 2/2006 |
| JP | 2006-165738 A | 6/2006 |
| JP | 2008-536367 A | 9/2008 |
| WO | WO 2006/101672 A1 | 9/2006 |

* cited by examiner

F I G. 1 1
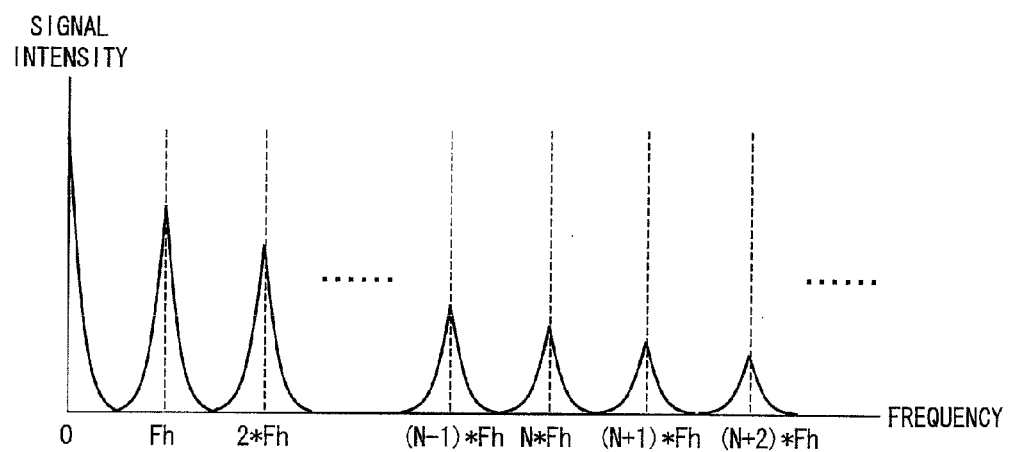
F I G. 1 2
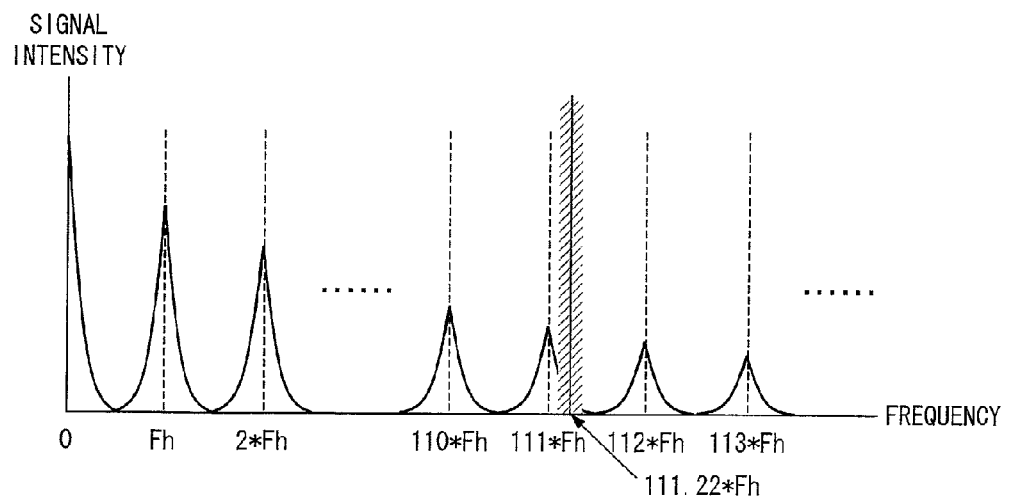

FRONT-END CIRCUIT, TUNER, AND TELEVISION BROADCASTING RECEIVER

This Nonprovisional application claims priority under 35 U.S.C. §119(a) on Patent Application No. 2009-201580 filed in Japan on Sep. 1, 2009, the entire contents of which are hereby incorporated by reference.

TECHNICAL FIELD

The present invention relates to a tuner and a front-end circuit for use in a television broadcasting receiver, etc. In particular, the present invention relates to a frequency control of a local oscillation signal in a case where an analog television signal is received with a direct conversion method.

BACKGROUND ART

In accordance with recent developments of electronics devices, demands for a low price receiver have been increased. "RF MICROELECTRONICS" by Behzad Razavi (published by Prentice Hall) describes in its sections 5.2.1 and 5.2.2 that a received signal is directly converted into a baseband signal with a receiving method called a direct conversion method (also called a zero IF method). Such a direct conversion method does not involve image response in principle, and accordingly does not require a filter which (i) has a precipitous filtering characteristic for eliminating images and (ii) is required in a heterodyne method. Accordingly, the receiving method with direct conversion allows an integrated circuit (IC) to have a function of a filter for channel selection. Therefore, the direct conversion method is attracting attention as a receiving method for meeting the demand for price reduction.

FIG. 10 is a block diagram illustrating a basic configuration of a tuner 400 which is included in a conventional direct conversion receiver. The tuner 400 includes a front-end circuit 410 and a demodulator circuit 9. The front-end circuit 410 includes a variable gain amplifier (RFVGA) 2, a multiplier (mixer) 3, a low-pass filter 4, a variable gain amplifier (IFVGA) 5, a local oscillator (VCO) 6, a local frequency control circuit 7, and a DC offset cancel circuit 8.

The RFVGA 2 amplifies an RF signal Frf received by an antenna 1. Thus amplified signal is subjected to a frequency conversion in which the amplified signal is mixed with an after-mentioned local oscillation signal (hereinafter, referred to as "local signal") by the mixer 3, so as to be converted into a baseband signal. The low-pass filter 4 attenuates components outside of a desired signal band of the baseband signal, whereby the desired signal is selected. Then, the desired signal is amplified by the IFVGA 5, and thus amplified desired signal is sent, as an IF output, to the demodulator circuit 9. The demodulator circuit 9 demodulates the IF output into a video signal and an audio signal.

The VCO 6 generates the local signal. The local frequency control circuit 7 controls a frequency of the local signal in accordance with a frequency of the RF signal, so that the baseband signal sent from the mixer 3 has a predetermined frequency.

The following describes a problem unique to the direct conversion receiver. In a case where a local signal sent from the VCO 6 is leaked to an RF port of the mixer 3, the mixer 3 mixes the leaked local signal with a local signal sent from the VCO 6 (self-mixing). In this case, the local signal sent from the VCO 6 and the leaked local signal have the same frequency. This causes the mixer 3 to output a baseband signal containing a DC component (DC offset). The DC offset may cause saturation in a subsequent circuit.

In view of the problem, the DC offset cancel circuit 8 included in the front-end circuit 410 eliminates the DC offset contained in the output supplied from the IFVGA 5. For example, the following Patent Documents 1 and 2 disclose techniques for eliminating DC offsets.

Citation List

Patent Documents

Patent Document 1

Japanese Patent Application Publication, Tokukaihei, No. 10-93647 A (Publication Date: Apr. 10, 1998)

Patent Document 2

Japanese Patent Application Publication, Tokukai, No. 2003-273945 A (Publication Date: Sep. 26, 2003)

SUMMARY OF INVENTION

Technical Problem

However, in a case where the RF signal Frf to be received is an analog television signal, there is a problem that a luminance signal contained in the video signal generated by demodulating the baseband signal would partially be eliminated when a DC offset is eliminated.

FIG. 11 is a view illustrating frequency spectra of a luminance signal contained in a video signal. Fh represents a line frequency. More specifically, Fh=4.5 MHz/286=15.734 kHz. Such a video signal has a property to have similar waveforms in a vertical direction. Accordingly, each of the frequency spectra of the luminance signal has a property to be equal to an integral multiple of the line frequency.

For example, the following describes a case where the RF signal Frf received by the antenna 1 is an analog television signal of VHF 1ch, with reference to the tuner 400 shown in FIG. 10. The analog television signal of 1ch has a center frequency of 93 MHz and a video frequency of 91.25 MHz. Accordingly, the local frequency control circuit 7 controls the VCO 6 to output a local signal having a frequency 93 MHz which is the same as the center frequency. As a result, a baseband signal which is sent from the mixer 3 and then passed through the low-pass filter 4 has a frequency of: 93 MHZ−91.25 MHz=1.75 MHz. Accordingly, when the DC offset is eliminated by the DC offset cancel circuit 8, a frequency component identical to that of the baseband signal is eliminated from the video signal which is generated by demodulating the baseband signal.

FIG. 12 is a view illustrating a state where the frequency component of the baseband signal is eliminated from the video signal shown in FIG. 11. As described above, the baseband signal has the frequency of 1.75 MHz. Accordingly, a component of 1.75 MHz in the video signal, that is, a component of 112.22 (=1.75 MHz/15.734 kHz)*Fh is eliminated. The frequency component to be eliminated has some degree of bandwidth, which is indicated by diagonal lines in FIG. 12.

According to FIG. 12, a frequency spectrum of 111*Fh in the luminance signal does not overlap with the frequency band indicated by the diagonal lines. Therefore, the luminance signal is not eliminated. However, the local signal outputted from the VCO 6 shown in FIG. 10 generally has a certain degree of a frequency deviation. Accordingly, in a case where the local signal has a frequency smaller than a desired frequency (93 MHz), the frequency spectrum of 111*Fh in the luminance signal can be eliminated if the frequency spectrum of 111*Fh overlaps with the frequency band indicated by the diagonal lines.

In a case of a digital signal, even when a part of frequency components is eliminated due to an elimination of a DC offset, there occurs no problem because the error will be compensated in general. On the other hand, in a case where the RF signal to be received is an analog television signal, a problem of video distortion would occur when frequency spectra in the luminance signal are partially eliminated.

The present invention is accomplished in view of the problems, and an object of the present invention is to provide a front-end circuit with which video distortion is not caused due to an elimination of a frequency spectrum from a luminance signal.

Solution to Problem

In order to attain the object, a front-end circuit according to the present invention is a direct conversion front-end circuit which includes: a local oscillator circuit which oscillates a local signal; a frequency conversion circuit which carries out a frequency conversion by mixing the local signal and a received signal, the frequency conversion circuit converting the received signal into a baseband signal; a DC offset cancel circuit which detects a DC offset contained in the baseband signal and then eliminates the DC offset; and a local frequency control circuit which controls a frequency of the local signal, in a case where the received signal is an analog television signal, the local frequency control circuit controlling the frequency of the local signal so that a frequency of the baseband signal differs from each of frequency spectra of a luminance signal contained in a video signal which is generated by demodulating the baseband signal.

According to the configuration, the frequency conversion circuit carries out a frequency conversion by mixing the local signal supplied from the local oscillator circuit and the received signal, thereby converting the received signal into the baseband signal. Accordingly, the frequency of the baseband signal becomes a frequency which is obtained by subtracting the frequency of the received signal from the frequency of the local signal. The DC offset cancel circuit detects the DC offset contained in the baseband signal and then eliminates the DC offset. In a case where the received signal is an analog television signal, a frequency component identical to that of the baseband signal is eliminated from the video signal which is generated by demodulating the baseband signal. In view of this, the local frequency control circuit controls the frequency of the local signal so that the frequency of the baseband signal differs from each frequency spectrum of the luminance signal contained in the video signal. Accordingly, none of frequency spectra of the luminance signal is eliminated. This makes it possible to provide the front-end circuit which can prevent video distortion caused when a frequency spectrum is eliminated from the luminance signal.

Advantageous Effects of Invention

As described above, the front-end circuit according to the present invention is a direct conversion front-end circuit which includes: a local oscillator circuit which oscillates a local signal; a frequency conversion circuit which carries out a frequency conversion by mixing the local signal and a received signal, the frequency conversion circuit converting the received signal into a baseband signal; a DC offset cancel circuit which detects a DC offset contained in the baseband signal and then eliminates the DC offset; and a local frequency control circuit which controls a frequency of the local signal, in a case where the received signal is an analog television signal, the local frequency control circuit controlling the frequency of the local signal so that a frequency of the baseband signal differs from each of frequency spectra of a luminance signal contained in a video signal which is generated by demodulating the baseband signal. This makes it possible to realize the front-end circuit with which video distortion would not be caused due to an elimination of a frequency spectrum from a luminance signal.

BRIEF DESCRIPTION OF DRAWINGS

FIG. 11 is a view illustrating frequency spectra of a luminance signal contained in a video signal.

FIG. 12 is a graph illustrating a state where a frequency component of a baseband signal is eliminated from the video signal shown in FIG. 11.

DESCRIPTION OF EMBODIMENTS

First Embodiment

The following describes a first embodiment of the present invention with reference to FIGS. 1 through 5.

Figure 1:
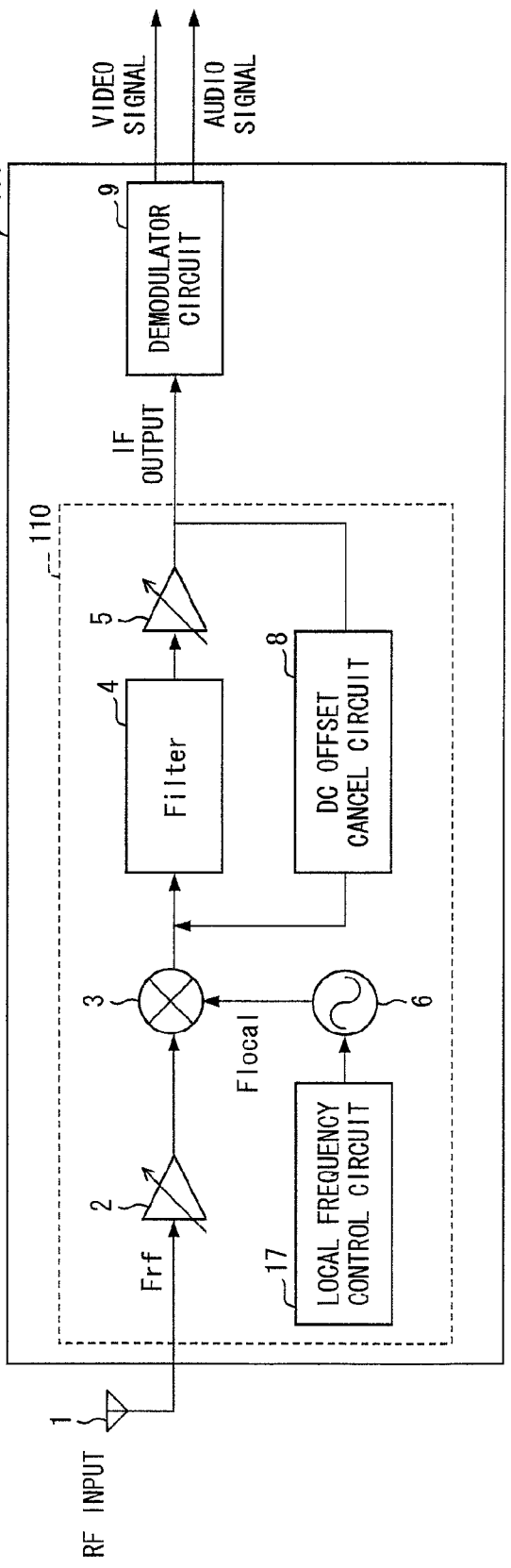
FIG. 1 is a block diagram illustrating a configuration of a tuner according to a first embodiment of the present invention.
Figure 10:
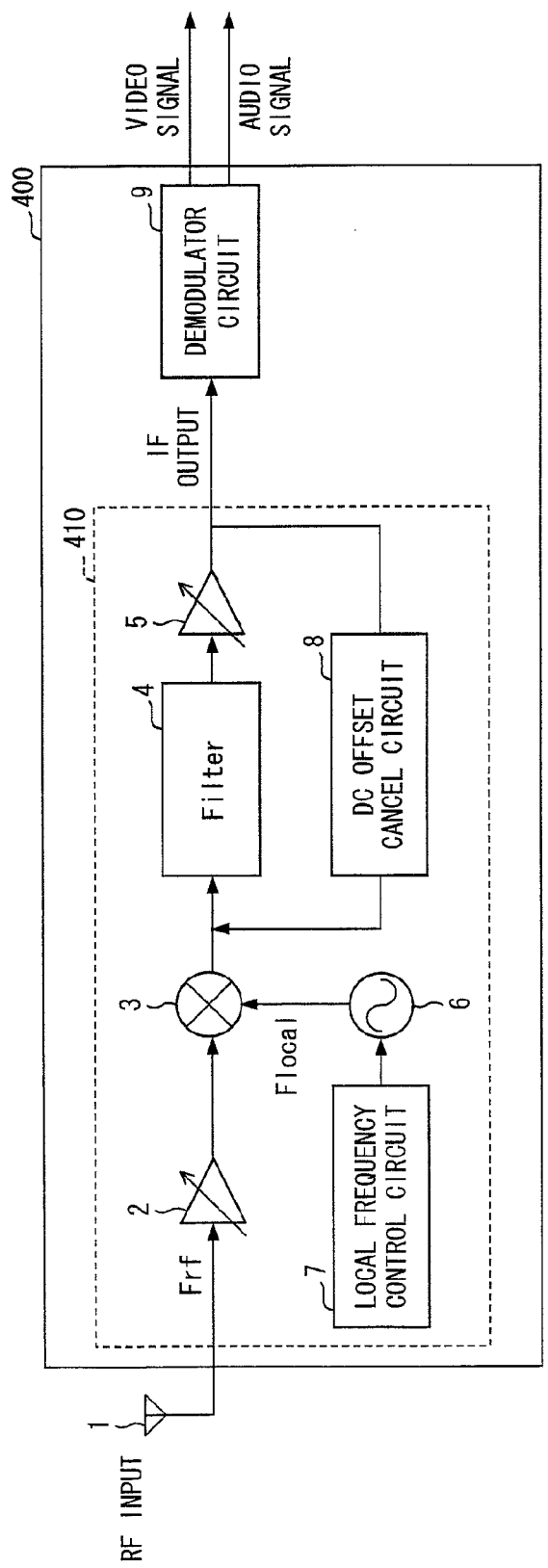
FIG. 10 is a block diagram illustrating a basic configuration of a tuner for use in a conventional direct conversion receiver.

FIG. 1 is a block diagram illustrating a configuration of a tuner 100 according to the present embodiment. The tuner 100 is different from the conventional tuner 400 (shown in FIG. 10) in that the tuner 100 includes a front-end circuit 110 instead of the front-end circuit 410. The front-end circuit 110 is different from the front-end circuit 410 in that the front-end circuit 110 includes a local frequency control circuit 17 instead of the local frequency control circuit 7. Note that, for convenience of explanation, members in the present embodiment having the same functions as those of the tuner 400 shown in FIG. 10 are given the same reference numerals, and explanations of the members are omitted.

The local frequency control circuit 17 has, in addition to the functions of the conventional local frequency control circuit 7, a function of controlling a frequency of a local signal so that the frequency of the baseband signal differs from each frequency spectrum of a luminance signal contained in a video signal which is generated by demodulating a baseband signal. Accordingly, the luminance signal in the video signal is not partially eliminated, whereby video distortion will not occur. The following specifically describes a case where an RF signal Frf (received signal) received by the antenna 1 is an analog television signal of VHF 1ch (which has a center frequency: 93 MHz, and a video frequency: 91.25 MHz) for example.

As described in "Technical Problem" of the present specification, the conventional local frequency control circuit 7 controls the VCO 6 to output a local signal having a frequency of 93 MHz which is equal to the center frequency. This leads to the elimination of the frequency component of 111.22*Fh from the video signal when the DC offset is eliminated by the DC offset cancel circuit 8 (see FIG. 12). In this case, the frequency spectrum of 111*Fh can be eliminated from the luminance signal depending on the eliminated frequency bandwidth or the frequency deviation of the local signal.

Figure 2:
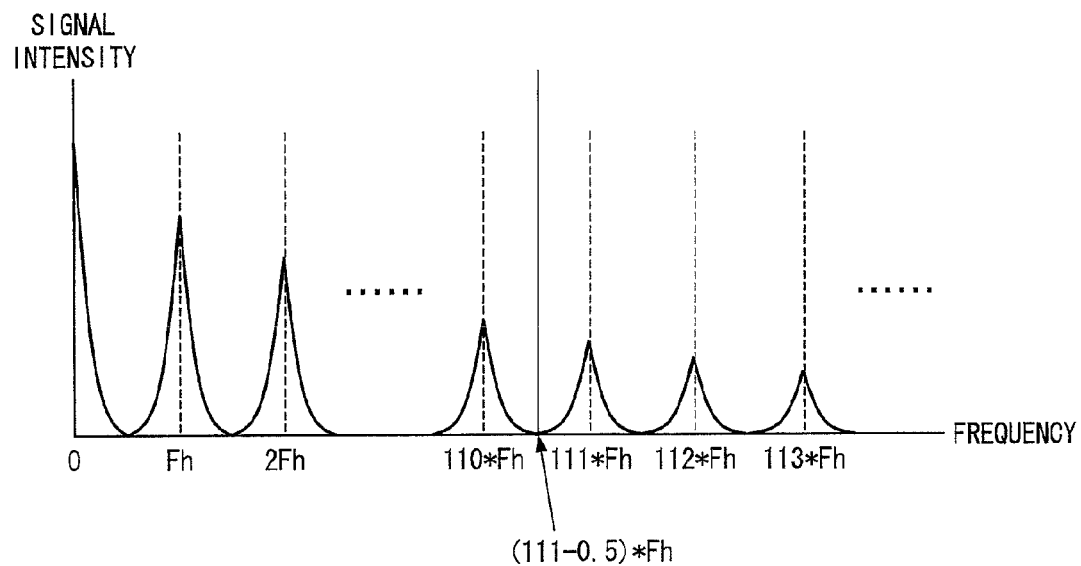
FIG. 2 is a view illustrating a video signal in which a part of frequency components is eliminated.

On the other hand, according to the present embodiment, the local frequency control circuit 17 controls a frequency of a local signal so that a frequency to be eliminated becomes an intermediate frequency between adjacent frequency spectra of a luminance signal, that is, so that the frequency to be eliminated becomes an arithmetic average of the adjacent frequency spectra of the luminance signal. For example, as shown in FIG. 2, the local frequency control circuit 17 controls the frequency of the local signal so that the frequency to be eliminated from the video signal becomes (111−0.5)*Fh.

The frequency to be eliminated is equal to a frequency of the baseband signal which is obtained by subtracting the video frequency from the frequency of the local signal. Accordingly, the local frequency control circuit 17 controls the frequency of the local signal so that the frequency of the local signal becomes:

91.25 MHz+(111−0.5)*$Fh$=

91.25 MHz+110.5*15.734 kHz=

91.25 MHz+1.738636 MHz=92.98864 MHz.

As a result, a video signal component of 1.738636 MHz is eliminated. A signal level of the luminance signal at the frequency is low, whereby video distortion does not occur even when the video signal component at the frequency is eliminated. Moreover, the frequency to be eliminated is an intermediate frequency between frequency spectra in the luminance signal, whereby the frequency spectra in the luminance signal cannot be eliminated even when the frequency component to be eliminated is varied in some degree depending on its bandwidth or a frequency deviation of the local signal.

Note that, in the above example, the intermediate frequency component between the frequency spectra of 110*Fh and 111*Fh is eliminated. However, the frequency component to be eliminated can be another frequency as long as the frequency does not cause an elimination of a frequency spectrum from the luminance signal.

Figure 3:
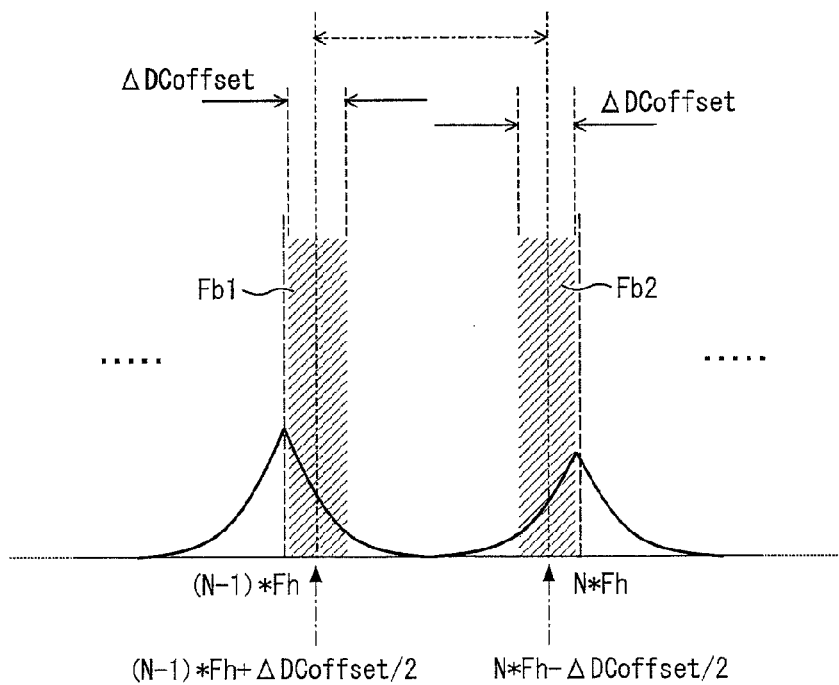
FIG. 3 is a view illustrating frequency spectra of (N−1)*Fh and N*Fh (where N is an integer) in a luminance signal.

The following describes a relation between a frequency bandwidth to be eliminated and a frequency of a local signal which the local frequency control circuit 17 is able to select. FIG. 3 is a view illustrating frequency spectra of (N−1)*Fh and N*Fh (where N is an integer) in a luminance signal. In FIG. 3, ΔDCoffset represents a frequency bandwidth to be eliminated, Fb1 represents a lower limit frequency band in which a frequency spectrum of (N−1)*Fh is not eliminated, and Fb2 represents an upper limit frequency band in which a frequency spectrum of N*Fh is not eliminated. In a case where the frequency of the baseband signal is (N−1)*Fh+ΔDCoffset/2, the band Fb1 is eliminated, and in a case where the frequency of the baseband signal is N*Fh−ΔDCoffset/2, the band Fb2 is eliminated. Accordingly, as long as the frequency of the baseband signal is within a range between (N−1)*Fh+ΔDCoffset/2 and N*Fh−ΔDCoffset/2 as indicated by a dashed-dotted two-way arrows in FIG. 3, the frequency spectra is not eliminated from the luminance signal. That is, within a range between the frequency spectra of (N−1)*Fh and N*Fh, the local frequency control circuit 17 can select a frequency of the local signal which frequency has a bandwidth represented as:

$N*Fh−\Delta DCoffset/2−((N−1)*Fh+\Delta DCoffset/2)=Fh−\Delta DCoffset$.

As is clear from the formula, the frequency bandwidth ΔDCoffset to be eliminated needs to be shorter than an interval between each frequency spectrum (i.e., a line frequency) of the luminance signal. However, the frequency bandwidth to be eliminated is approximately 100 Hz in general, whereby the frequency spectra of the luminance signal will not be eliminated regardless of a selected frequency of the local signal. Moreover, as the frequency bandwidth to be eliminated becomes narrower, the local frequency control circuit 17 can select a frequency of the local signal from a wider bandwidth. This allows the local frequency control circuit 17 to easily control a frequency.

Note that, in general, the local frequency control circuit 17 is made up of a PLL synthesizer. This causes the VCO 6 to gradually switch frequencies of a local signal at predetermined frequency intervals. The frequency intervals of the local signal at which the VCO 6 is able to oscillate (hereinafter, referred to as "frequency intervals ΔFstep") are preferable to be as short as possible. In the present embodiment, the frequency intervals ΔFstep are set to be shorter than the frequency spectrum intervals (=15.734 kHz) of the luminance signal.

Figure 4:
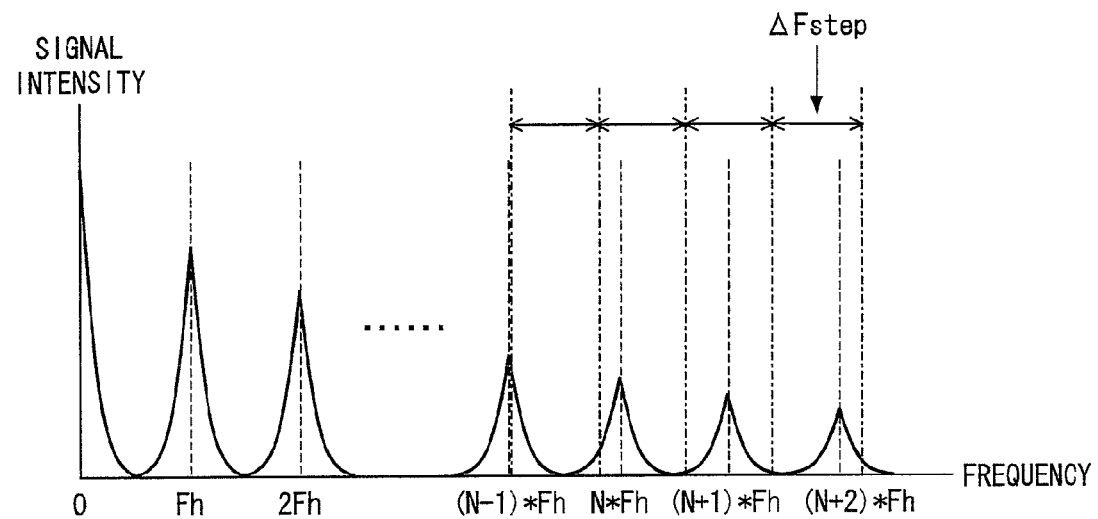
FIG. 4 is a view illustrating frequency spectra of a luminance signal contained in a video signal.

FIG. 4 is a view illustrating frequency spectra of a luminance signal contained in a video signal. In FIG. 4, dashed-dotted lines represent frequencies to be eliminated when the VCO 6 switches frequencies of a local signal. The frequencies to be eliminated are equal to frequencies of a baseband signal, and each interval between the frequencies to be eliminated is equal to each of the frequency intervals ΔFstep because the local signal and the baseband signal have identical frequency intervals.

As described above, the frequency intervals ΔFstep are shorter than the frequency spectrum intervals of the luminance signal. Accordingly, a frequency to be eliminated can be selected from a range between arbitrary frequency spectra of the luminance signal. For example, in a case where the local frequency control circuit 17 controls a frequency of the local signal and consequently a frequency to be eliminated is set to be (N−1)*Fh which overlaps with a spectrum of the luminance signal, the elimination of the luminance signal can be prevented by controlling the frequency of the local signal so that the frequency to be eliminated is switched toward a higher-frequency side or a lower-frequency side.

Figure 5:
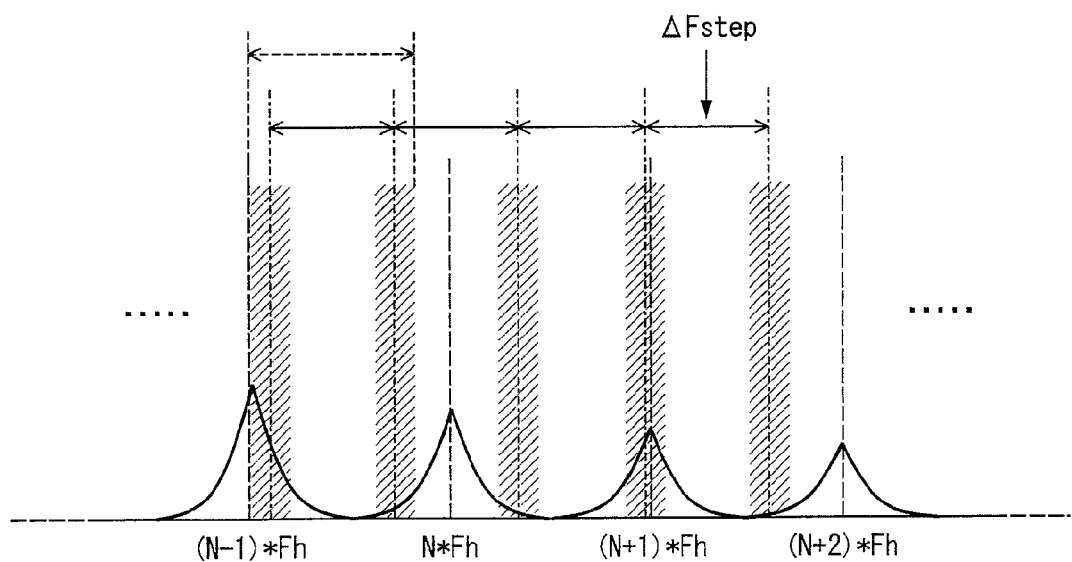
FIG. 5 is a view illustrating frequency spectra between (N−1)*Fh and (N+2)*Fh (where N is an integer) in a luminance signal.

Moreover, a sum of the frequency intervals ΔFstep and the frequency bandwidth to be eliminated from the video signal is preferable to be smaller than the frequency spectrum intervals of the luminance signal. FIG. 5 is a view illustrating frequency spectra between (N−1)*Fh and (N+2)*Fh (where N is an integer) in the luminance signal. In FIG. 5, dashed-dotted lines represent frequencies to be eliminated when the VCO 6 switches frequencies of a local signal. Regions with diagonal lines represent frequency bands to be eliminated. Moreover, a sum of the frequency interval ΔFstep and the frequency bandwidth to be eliminated is indicated by dashed two-way arrows.

In FIG. 5, the frequency bandwidth indicated by the dashed two-way arrows is shorter than the frequency spectrum intervals of the luminance signal. Further, at an initial state, a frequency band to be eliminated is a leftmost frequency band. Accordingly, even in a case where a frequency spectrum of the luminance signal is to be eliminated, the elimination can be avoided by simply shifting the frequency band to be eliminated to a next frequency band to be eliminated. That is, the VCO 6 can switch the frequencies of the local signal at a smallest width. This allows the local frequency control circuit 17 to control frequencies more easily.

Note that the frequency of the local signal is preferable to be oscillated at intervals as short as possible. Therefore, the VCO 6 and the local frequency control circuit 17 in the present embodiment are realized by a technique such as a fractional PLL.

Note that the VCO 6 can oscillate the local signal having frequency intervals which are longer than the frequency spectrum intervals of the luminance signal. In that case, a frequency to be eliminated cannot be selected from a range between arbitrary frequency spectra of the luminance signal. However, it is possible to control the frequency to be eliminated so as not to conform to any of the frequency spectra of the luminance signal.

Note however that, in a case where the frequency intervals at which the VCO 6 is able to oscillate the local signal are equal to an integral multiple of the frequency spectrum intervals of the luminance signal, when the frequency to be eliminated is conformed to a frequency spectrum of the luminance signal due to a frequency deviation of the local signal, etc., the frequency of the local signal needs to be increased so that the frequency to be eliminated covers a frequency band within which a spectrum of the luminance signal no longer exists. In view of this, the frequency intervals at which the VCO 6 is able to oscillate the local signal is preferable not to be an integral multiple of the frequency spectrum intervals of the luminance signal. In other words, the frequency intervals at which the VCO 6 is able to oscillate the local signal are preferable to be a+b times (where "a" is a natural number and "b" is a decimal number) larger than the frequency spectrum intervals of the luminance signal.

Note that the switching of frequencies of the local signal is preferable to be carried out during a vertical blanking interval because noise occurs from the VCO 6 and the local frequency control circuit 17 while the frequencies of the local signal are being switched. This makes it possible to prevent video distortion caused due to the noise.

It is also preferable that the DC offset cancel circuit 8 carries out an elimination operation of a DC offset during the vertical blanking interval. This makes it possible to prevent video distortion caused due to noise which is generated while the DC offset is being detected. During periods other than the vertical blanking interval in this case, the DC offset cancel circuit 8 holds a DC offset detected in advance and eliminates the offset in an output supplied from the IFVGA 5.

Note that a broadcasting signal contains a color signal and an audio signal (not illustrated) in addition to the luminance signal. Video distortion and audio distortion will occur in a case where the color signal and the audio signal are eliminated when the DC offset is eliminated by the DC offset cancel circuit 8. Therefore, it is preferable that the local frequency control circuit 17 controls the frequency of the local signal so that the frequency of the baseband signal differs from each frequency spectrum of the color signal and the audio signal contained in the broadcasting signal. Note that the audio signal and the color signal have comparatively high frequencies, that is, frequency spectra of 4.5 MHz and 3.5795 MHz, respectively. Accordingly, the color signal and the audio signal are not eliminated due to a generally selected frequency of the local signal.

Second Embodiment

Figure 6:
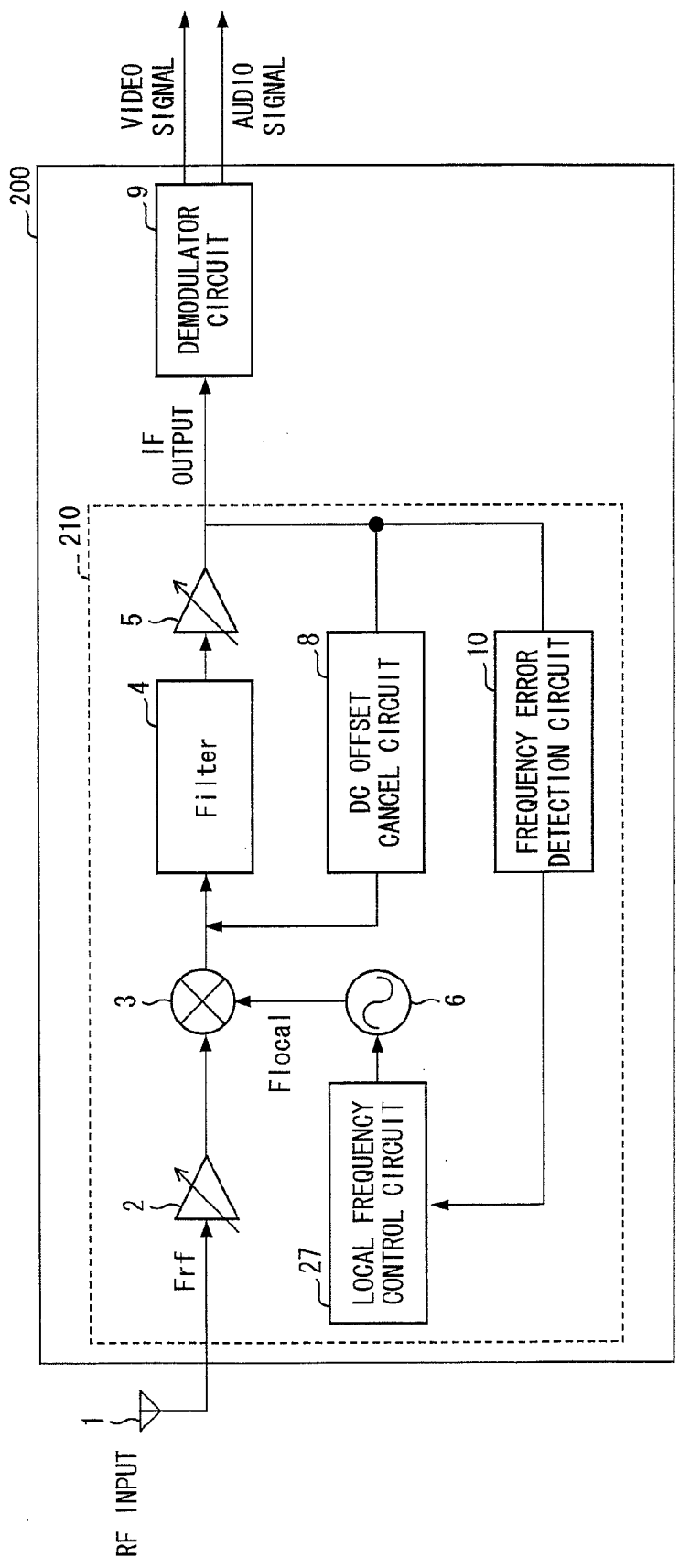
FIG. 6 is a block diagram illustrating a configuration of a tuner according to a second embodiment of the present invention.
Figure 7:
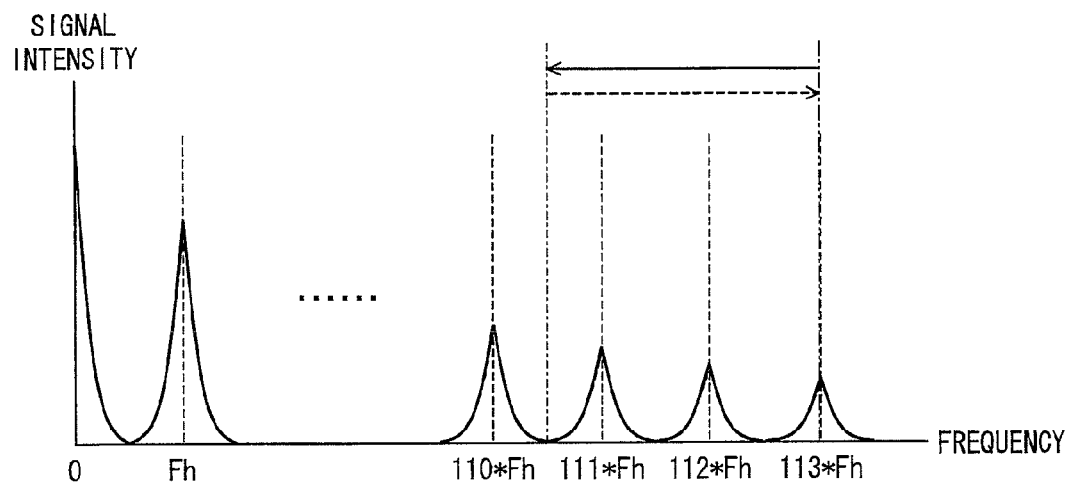
FIG. 7 is a view illustrating a video signal in which a part of frequency components is eliminated.
Figure 8:
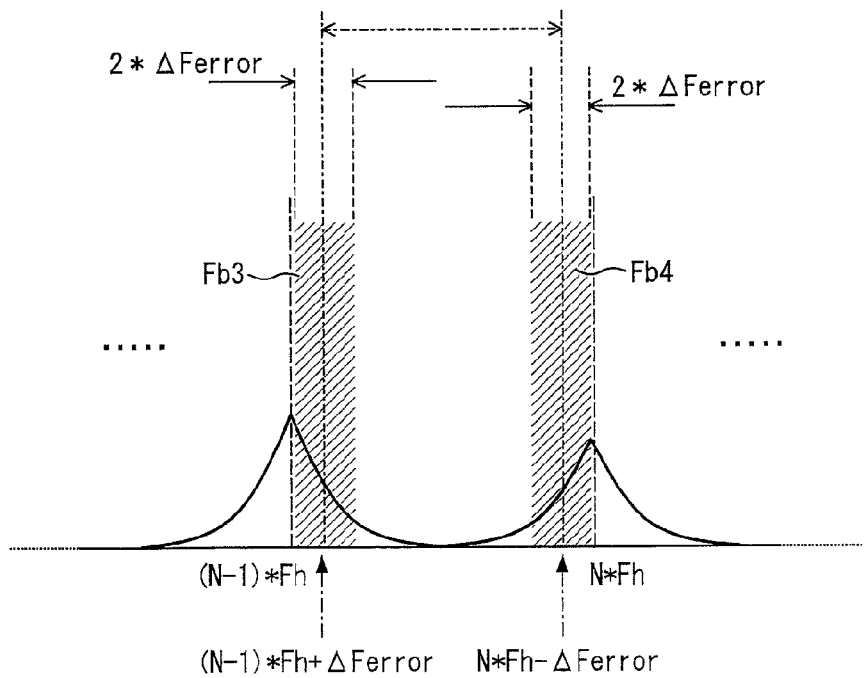
FIG. 8 is a view illustrating frequency spectra of (N−1)*Fh and N*Fh (where N is an integer) in a luminance signal.

The following describes a second embodiment of the present invention with reference to FIGS. 6 through 8. It is desirable that a predetermined frequency of a local signal supplied from the VCO 6 is not different from an actual output frequency. However, in a case where, for example, a crystal oscillator is used as a reference oscillator which generates a reference signal used in a frequency control by the local frequency control circuit 17, the local signal can have a frequency error with respect to a desired frequency because the reference signal has a frequency deviation. According to the present embodiment, a frequency of the local signal is controlled in consideration of the frequency error of the local signal.

FIG. 6 is a block diagram illustrating a configuration of a tuner 200 according to the present embodiment. The tuner 200 is different from the tuner 100 shown in FIG. 1 in that the tuner 200 includes a front-end circuit 210 instead of the front-end circuit 110. The front-end circuit 210 is different from the front-end circuit 110 in that the front-end circuit 210 includes a local frequency control circuit 27 instead of the local frequency control circuit 17 and further includes a frequency error detection circuit 10. Note that, for convenience of explanation, members in the present embodiment having the same functions as those of the tuner 100 shown in FIG. 1 are given the same reference numerals, and explanations of the members are omitted.

The frequency error detection circuit 10 has a function of detecting a frequency error of a local signal based on an IF output supplied from the IFVGA 5. In accordance with the frequency error detected by the frequency error detection circuit 10, the local frequency control circuit 27 controls a frequency of the local signal so that a frequency of a baseband signal differs from each frequency spectrum of a luminance signal contained in a video signal which is generated by demodulating the baseband signal. The present embodiment specifically describes a case where an RF signal received by the antenna 1 is an analog television signal of UHF 62ch (which has a center frequency: 767 MHz, and a video frequency: 765.25 MHz) for example.

Assuming that the local signal has no frequency error, a frequency of the baseband signal becomes an intermediate frequency between adjacent frequency spectra when the frequency of the local signal is indicated as, for example, 765.25 MHz+4.5 MHz/286*(111−0.5)=766.98864 MHz. In this case, a frequency (110.5*Fh) indicated by a dotted-dashed line in FIG. 7 is eliminated, whereby none of frequency spectra of the luminance signal is eliminated.

In a case where the reference signal which is used in a frequency control by the local frequency control circuit 27 has a frequency error of +51.17 ppm, an actual frequency of the local signal becomes 767.02788 MHz which is higher than the ideal frequency by $$766.98864 \text{ MHz} * 51.17/10^6 = 39.2468 \text{ kHz}.$$

In this case, the frequency of the baseband signal is 767.02788 MHz−765.25 MHz=1.77788 MHz, whereby a frequency (113*Fh) indicated by a dashed-two dotted line in FIG. 7 is eliminated. That is, a frequency spectrum of the luminance signal is eliminated, whereby video distortion can occur.

Note that, in the ideal case where the local signal has no frequency error, the IF output supplied from the IFVGA 5 becomes 766.98864 MHz−765.25 MHz=1.73864 MHz.

On the other hand, in the case where the reference signal which is used in a frequency control by the local frequency control circuit 27 has the frequency error of +51.17 ppm, the IF output supplied from the IFVGA 5 becomes 767.02788 MHz−765.25 MHz=1.77788 MHz, which is higher than the ideal frequency by 39.2468 kHz.

The frequency error detection circuit 10 shown in FIG. 6 detects that the actual IF frequency (1.77788 MHz) is different from the ideal IF frequency (1.73864 MHz), thereby detecting the frequency error (+39.2468 kHz) of the local signal. In accordance with the detected frequency error, the local frequency control circuit 27 calculates a set frequency necessary to obtain a frequency of the local signal to be supplied from the VCO 6. In the case of the example, if the local frequency control circuit 27 controls the VCO 6 to output a local signal of 766.98864 MHz/(1+51.17/10$^6$)=766.94939 MHz, a local signal actually outputted from the VCO 6 has a frequency of 766.98864 MHz (=766.98865 MHz/(1+51.17/10$^6$)*(1+51.17/10$^6$)). This makes it possible to eliminate the frequency (110.5*Fh) indicated by the dotted-dashed line in FIG. 7.

Note that the frequency error of the local signal detected by the frequency error detection circuit 10 is uneven to some extent. Accordingly, it is preferable to set a frequency of the local signal in consideration of detection accuracy of a frequency error which the frequency error detection circuit 10 is able to detect. The following describes a relation between (i) a spectrum space corresponding to frequency error detection accuracy of the frequency error detection circuit 10 and (ii) a set frequency of the local signal.

In a case where frequency error detection accuracy is ΔFerror=50 Hz and a frequency of the local signal is set so that a frequency of a video signal within a range of N*Fh±ΔFerror (where N is an integer) is to be eliminated, a frequency spectrum of the luminance signal can be eliminated. In view of this, the local frequency control circuit 27 sets the frequency of the local signal so that a frequency of the video signal outside the range of N*Fh±ΔFerror (where N is an integer) is to be eliminated.

FIG. 8 is a view illustrating frequency spectra of (N−1)*Fh and N*Fh (where N is an integer) in the luminance signal. In FIG. 8, Fb3 represents a lower limit frequency band in which a frequency spectrum of (N−1)*Fh is not eliminated, and Fb4 represents an upper limit frequency band in which a frequency spectrum of N*Fh is not eliminated. In a case where the frequency of the baseband signal is (N−1)*Fh+ΔFerror, a frequency of (N−1)*Fh in the luminance signal can be eliminated. In a case where the frequency of the baseband signal is N*Fh−ΔFerror, a frequency of N*Fh in the luminance signal can be eliminated. Accordingly, as long as the frequency of the baseband signal is between (N−1)*Fh+ΔFerror (exclusive) and N*Fh−ΔFerror (exclusive) as indicated by a dashed-dotted two-way arrows in FIG. 8, none of frequency spectra of the luminance signal would be eliminated. That is, within a range between (N−1)*Fh and N*Fh, the local frequency control circuit 27 can select a frequency of the local signal which frequency has a bandwidth represented as:

N*Fh−ΔFerror−((N−1)*Fh+ΔFerror)=Fh−2*ΔFerror.

As is clear from the formula, a twofold value of the frequency error detection accuracy ΔFerror needs to be smaller than frequency spectrum intervals (that is, a line frequency) of the luminance signal. However, the frequency error detection accuracy ΔFerror is approximately 50 Hz in general, whereby none of the frequency spectra of the luminance signal would be eliminated regardless of set frequencies of the local signal.

Note that the frequency error detection accuracy ΔFerror is preferable to be as small as possible. Similarly, a frequency bandwidth ΔDCoffset which is eliminated from a video signal when the DC offset cancel circuit 8 eliminates a DC offset is also preferable to be as small as possible. According to the present embodiment, a sum of a twofold of the frequency error detection accuracy ΔFerror and the frequency bandwidth ΔDCoffset is smaller than frequency spectrum intervals of the luminance signal. Accordingly, as long as a frequency to be eliminated is at least an intermediate frequency between adjacent frequency spectra of the luminance signal, that is, as long as the frequency to be eliminated is an arithmetic average of the adjacent frequency spectra of the luminance signal, the frequency spectra will not be eliminated.

Moreover, according to the present embodiment, as with the first embodiment, frequency intervals ΔFstep at which the VCO 6 is able to oscillate the local signal are preferable to be as small as possible. More specifically, a sum of the frequency intervals ΔFstep and twofold frequency error detection accuracy ΔFerror is preferable to be smaller than frequency spectrum intervals of the luminance signal. This makes it possible to select a frequency between arbitrary frequency spectra in the luminance signal as a frequency to be eliminated from a video signal when the DC offset cancel circuit 8 eliminates a DC offset.

Moreover, it is also preferable that a sum of the frequency intervals ΔFstep, the twofold frequency error detection accuracy ΔFerror, and the frequency bandwidth ΔDCoffset which is to be eliminated from the video signal when the DC offset cancel circuit 8 eliminates a DC offset is smaller than the frequency spectrum intervals of the luminance signal. This allows the local frequency control circuit 27 to control a frequency more easily.

In the present embodiment, the frequency error detection circuit 10 detects a frequency error of a local signal based on an IF output supplied from the IFVGA 5. However, the present invention is not limited to this. For example, the frequency error detection circuit 10 can detect a frequency error of the local signal based on another signal such as an output signal supplied from the low-pass filter 4.

Note that a frequency error of a reference signal which is used in a frequency control by the local frequency control circuit 27 is not constant but changes in accordance with ambient temperature and time elapsed from when a power is supplied, etc. Accordingly, even though a frequency of the local signal is set once by the local frequency control circuit 27, a frequency spectrum can be eliminated when the frequency error becomes larger as time passes.

In view of this, in the present embodiment, in a case where a frequency error detected by the frequency error detection circuit 10 is larger than a predetermined threshold value, the local frequency control circuit 27 switches frequencies of the local signal and selects again a frequency to be eliminated from the video signal. The threshold value can be, for example, a difference between the frequency to be eliminated from the video signal and a frequency spectrum of the luminance signal which spectrum is the nearest to the frequency to be eliminated. For example, in a case where a frequency 110.3*Fh is to be eliminated from the video signal while a period between turning on the power supply and a first setting, a frequency spectrum of 110*Fh can be eliminated when the frequency error becomes greater than 0.3*Fh, because a difference between the frequency to be eliminated and the frequency spectrum of 110*Fh is 0.3*Fh. In view of this, in a case where the frequency error is greater than 0.3*Fh, the local frequency control circuit 27 switches frequencies of the local signal so that the frequency to be eliminated from the video signal becomes, for example, 110.5*Fh. This makes it possible to avoid eliminating a frequency spectrum of the luminance signal. Note that the threshold frequency can be set to a frequency (e.g., 0.25*Fh in the above example) which is smaller than a difference between the frequency to be eliminated from the video signal and the frequency spectrum of the luminance signal which spectrum is the nearest to the frequency to be eliminated. This makes it possible to avoid eliminating a frequency spectrum of the luminance signal more certainly.

Note that the local frequency control circuit 27 can constantly observe output signals supplied from the frequency error detection circuit 10. However, it is preferable that the output signals supplied from the frequency error detection circuit 10 are absorbed every predetermined period. That is, it is preferable that the frequency error detection circuit 10 outputs a detected frequency error to the local frequency control circuit 27 every predetermined period. The predetermined period can be set as appropriate in accordance with a speed of change in a frequency error. For example, the frequency error detection circuit 10 can send a result of a detected frequency error to the local frequency control circuit 27 every frame period. This makes it possible to reduce power consumption of the front-end circuit 210.

It is preferable that the local frequency control circuit 27 switches frequencies of the local signal during a vertical blanking interval. It is also preferable that the frequency error detection circuit 10 detects a frequency error during the vertical blanking interval. This makes it possible to prevent video distortion which occurs due to noise generated by the local frequency control circuit 27 and the frequency error detection circuit 10.

Similarly, it is also preferable that the DC offset cancel circuit 8 detects a DC offset during the vertical blanking interval. This makes it possible to prevent video distortion which occurs due to noise generated while the DC offset is being detected.

Third Embodiment

Figure 9:
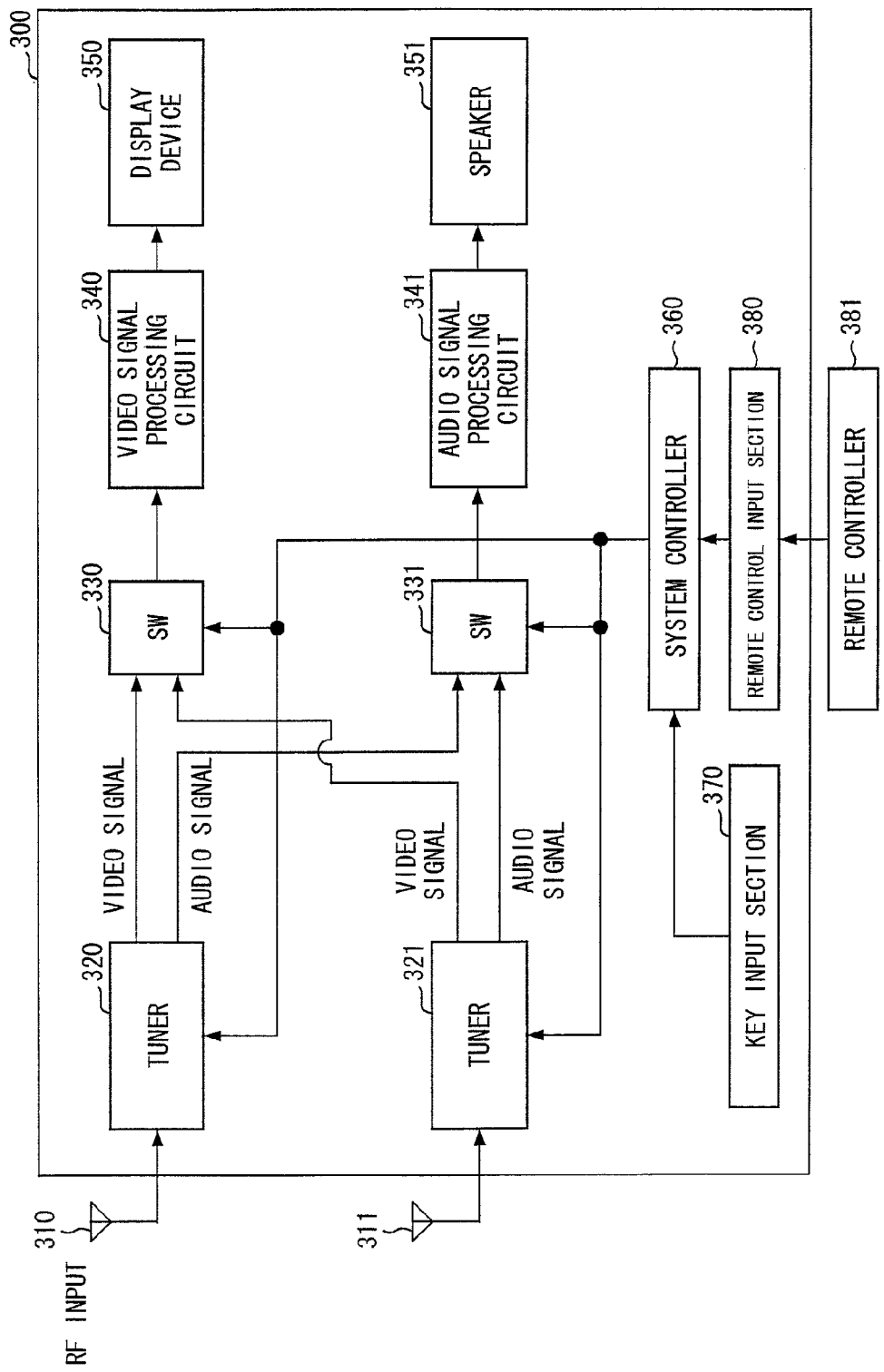
FIG. 9 is a block diagram illustrating a configuration of a television broadcasting receiver according to a third embodiment of the present invention.

The following describes a third embodiment of the present invention with reference to FIG. 9.

FIG. 9 is a block diagram illustrating a configuration of a television broadcasting receiver 300 according to the present embodiment. The television broadcasting receiver 300 is a receiver which receives RF signals sent from an antenna 310 and an antenna 311. The television broadcasting receiver 300 includes tuners 320 and 321, switches 330 and 331, a video signal processing circuit 340, an audio signal processing circuit 341, a display device 350, a speaker 351, a system controller 360, a key input section 370, and a remote control input section 380.

The RF signals received by the antennas 310 and 311 are sent to the tuners 320 and 321, respectively. Each of the tuners 320 and 321 converts the RF signal into an IF signal, and then demodulates the IF signal into a video signal and an audio signal. The video signals are sent from the tuners 320 and 321 to the switch 330 and the audio signals are sent from the tuners 320 and 321 to the switch 331.

The switch 330 determines, in response to a control signal sent from the system controller 360, which one of the video signals from the tuners 320 and 321 is to be sent to the video signal processing circuit 340. The switch 331 determines, in response to a control signal sent from the system controller 360, which one of the audio signals from the tuners 320 and 321 is to be sent to the audio signal processing circuit 341. The video signal processing circuit 340 sends a video signal of a currently selected channel to the display device 350. The audio signal processing circuit 341 sends an audio signal of a currently selected channel to the speaker 351.

The key input section 370 is a functional block receiving input operations to keys which are provided in a front face of a housing. The remote control input section 380 is a functional block which receives an operation signal sent from a remote controller 381. The system controller 360 controls the tuners 320 and 321 and the switches 330 and 331 in response to an operation signal sent from the key input section 370 or the remote control input section 380.

The television broadcasting receiver 300 according to the present embodiment is provided with, as the tuners 320 and 321, the tuners 100 in the first embodiment or the tuners 200 in the second embodiment. This makes it possible to prevent elimination of a frequency spectrum from a luminance signal even in a case where the RF signals received by the antennas 310 and 311 are analog television signals. Accordingly, the television broadcasting receiver 300 can carry out an appropriate video display. Note that the antenna 310 can send a signal to the tuner 321 (i.e., the antenna 311 can be omitted).

Summary of Embodiments

The present invention is not limited to the description of the present embodiments above, but can be modified by a skilled person in the art within the scope of the claims. An embodiment derived from a proper combination of technical means disclosed in respective different embodiments is also encompassed in the technical scope of the present invention.

It is preferable that the front-end circuit of the present invention further includes a frequency error detection circuit which detects a frequency error of the local signal, wherein the local frequency control circuit controls, in accordance with the frequency error, the frequency of the local signal so that the frequency of the baseband signal differs from each of the frequency spectra of the luminance signal contained in the video signal.

According to the configuration, even in a case where a frequency error of the local signal is caused due to a frequency deviation of the reference signal used for a frequency control, the frequency error detection circuit detects the frequency error of the local signal and then the local frequency control circuit controls, in accordance with the frequency error, the frequency of the local signal so that the frequency of the baseband signal differs from each of the frequency spectra of the luminance signal contained in the video signal which is generated by demodulating the baseband signal. That is, the local frequency control circuit controls the frequency of the local signal by compensating the frequency error of the local signal. This makes it possible to prevent an elimination of a frequency spectrum from the luminance signal even in a case where the local oscillator circuit cannot output a local signal having a desired frequency.

In the front-end circuit of the present invention, it is preferable that the local frequency control circuit controls the frequency of the local signal so that the frequency of the baseband signal becomes an arithmetic average of adjacent frequency spectra of the luminance signal.

According to the configuration, it is possible to eliminate an arithmetic average frequency of the adjacent frequency spectra of the luminance signal, that is, an exactly intermediate frequency between the adjacent frequency spectra. This makes it possible to prevent an elimination of a frequency spectrum from the luminance signal even when the frequency of the local signal has some degree of error.

In the front-end circuit of the present invention, it is preferable that $\Delta Fstep=\Delta Fh*(a+b)$, where $\Delta Fstep$ is frequency intervals at which the local oscillator circuit is able to oscillate the local signal, $\Delta Fh$ is frequency spectrum intervals of the luminance signal, "a" is a natural number, and "b" is a decimal number.

According to the configuration, it is not necessary to increase the frequency of the local signal so that a frequency to be eliminated becomes larger than the maximum frequency spectrum of the luminance signal. Accordingly, the frequency of the local signal can be controlled easily.

In the front-end circuit of the present invention, it is preferable that $\Delta Fstep<\Delta Fh$.

According to the configuration, it is possible for the local frequency control circuit to select, as a frequency to be eliminated from the video signal, a frequency between arbitrary frequency spectra of the luminance signal.

In the front-end circuit of the present invention, it is preferable that $\Delta Fstep+\Delta DCoffset<\Delta Fh$, where $\Delta DCoffset$ is a frequency bandwidth to be eliminated from the video signal when the DC offset cancel circuit eliminates the DC offset.

According to the configuration, at an initial state, frequencies of the local signal can be switched at a smallest width even in a case where a frequency band to be eliminated overlaps with a frequency spectrum of the local signal. This allows the local frequency control circuit to control a frequency more easily.

In the front-end circuit of the present invention, it is preferable that $2\times\Delta Ferror+\Delta DCoffset<\Delta Fh$, where $\Delta Ferror$ is a frequency width corresponding to detection accuracy of the frequency error detected by the frequency error detection circuit, $\Delta DCoffset$ is a frequency bandwidth to be eliminated from the video signal when the DC offset cancel circuit eliminates the DC offset, and $\Delta Fh$ is frequency spectrum intervals of the luminance signal.

According to the configuration, none of frequency spectra of the luminance signal will be eliminated as long as the frequency to be eliminated is at least an intermediate frequency between the adjacent frequency spectra of the luminance signal, that is, at least an arithmetic average of the adjacent frequency spectra of the luminance signal.

In the front-end circuit of the present invention, it is preferable that $2\times\Delta Ferror+\Delta Fstep<\Delta Fh$, where $\Delta Ferror$ is a frequency width corresponding to detection accuracy of the frequency error detected by the frequency error detection circuit, $\Delta Fstep$ is frequency intervals at which the local oscillator circuit is able to oscillate the local signal, and $\Delta Fh$ is frequency spectrum intervals of the luminance signal.

According to the configuration, it is possible for the local frequency control circuit to select, as a frequency to be eliminated from the video signal, a frequency between arbitrary frequency spectra of the luminance signal.

In the front-end circuit of the present invention, it is preferable that $2\times\Delta Ferror+\Delta DCoffset+\Delta Fstep<\Delta Fh$, where $\Delta Fstep$ is frequency intervals at which the local oscillator circuit is able to oscillate the local signal.

According to the configuration, the local frequency control circuit can control a frequency more easily.

In the front-end circuit of the present invention, it is preferable that, in a case where the frequency error is larger than a predetermined threshold value, the local frequency control circuit switches frequencies of the local signal.

According to the configuration, even when the frequency error becomes larger as time passes, it is possible to deal with the increase in the frequency error because the local frequency control circuit switches frequencies of the local signal and selects again a frequency to be eliminated from the video signal.

In the front-end circuit of the present invention, it is preferable that, every predetermined period of time, the frequency error detection circuit sends a detection result of a detected frequency error to the local frequency control circuit.

According to the configuration, it is possible to reduce power consumption of the front-end circuit, as compared to a case where the frequency error detection circuit constantly sends results of detected frequency errors to the local frequency control circuit.

In the front-end circuit of the present invention, it is preferable that the DC offset cancel circuit detects the DC offset during a vertical blanking interval.

According to the configuration, it is possible to avoid video distortion caused due to noise which is generated while the DC offset cancel circuit is detecting a DC offset.

In the front-end circuit of the present invention, it is preferable that the local frequency control circuit switches the frequencies of the local signal during a vertical blanking interval.

According to the configuration, it is possible to avoid video distortion caused due to noise which is generated while the local frequency control circuit is switching frequencies of a local signal.

In the front-end circuit of the present invention, it is preferable that the frequency error detection circuit detects the frequency error of the local signal during a vertical blanking interval.

According to the configuration, it is possible to avoid video distortion caused due to noise which is generated by the frequency error detection circuit which is detecting a frequency error of the local signal.

In the front-end circuit of the present invention, it is preferable that the local frequency control circuit controls the frequency of the local signal so that the frequency of the baseband signal differs from each of frequency spectra of a color signal contained in the video signal which is generated by demodulating the baseband signal.

According to the configuration, it is possible to prevent an elimination of a frequency spectrum from the color signal contained in the video signal. Accordingly, video distortion will not occur.

In the front-end circuit of the present invention, it is preferable that the local frequency control circuit controls the frequency of the local signal so that the frequency of the baseband signal differs from each of frequency spectra of an audio signal which is generated by demodulating the baseband signal.

According to the configuration, it is possible to prevent an elimination of a frequency spectrum from the audio signal. Accordingly, audio distortion will not occur.

A tuner of the present invention includes any one of the front-end circuits described above.

A television broadcasting receiver of the present invention includes the tuner.

According to the configuration, even when the received signal is an analog television signal, none of frequency spectra of the luminance signal will be eliminated. This makes it possible to provide the television broadcasting receiver which can carry out an appropriate video display.

INDUSTRIAL APPLICABILITY

The present invention can be used for (i) a television device such as a liquid crystal display device and (ii) a personal computer and a mobile phone, etc. which have a television broadcasting receiving function.

REFERENCE SIGNS LIST

1: Antenna
2: RFVGA
3: Mixer (Frequency conversion circuit)
4: Low-pass filter
5: IFVGA
6: VCO (Local oscillator circuit)
7: Local frequency control circuit
8: DC offset cancel circuit
9: Demodulator circuit
10: Frequency error detection circuit
17: Local frequency control circuit
27: Local frequency control circuit
100: Tuner
110: Front-end circuit
200: Tuner
210: Front-end circuit
300: Television broadcasting receiver
310: Antenna
311: Antenna
320: Tuner
321: Tuner
330: Switch
331: Switch
340: Video signal processing circuit
341: Audio signal processing circuit
350: Display device
351: Speaker
360: System controller
370: Key input section
380: Remote control input section
381: Remote controller
400: Tuner
410: Front-end circuit

The invention claimed is:

1. A direct conversion front-end circuit comprising:
a local oscillator circuit which oscillates a local signal;
a frequency conversion circuit which carries out a frequency conversion by mixing the local signal and a received signal, the frequency conversion circuit converting the received signal into a baseband signal;
a DC offset cancel circuit which detects a DC offset contained in the baseband signal and then eliminates the DC offset; and
a local frequency control circuit which controls a frequency of the local signal,
in a case where the received signal is an analog television signal, the local frequency control circuit controlling the frequency of the local signal so that a frequency of the baseband signal differs from each of frequency spectra of a luminance signal contained in a video signal which is generated by demodulating the baseband signal.

2. A front-end circuit as set forth in claim 1, further comprising:
a frequency error detection circuit which detects a frequency error of the local signal,
wherein the local frequency control circuit controls, in accordance with the frequency error, the frequency of the local signal so that the frequency of the baseband signal differs from each of the frequency spectra of the luminance signal contained in the video signal.

3. The front-end circuit as set forth in claim 1, wherein:
the local frequency control circuit controls the frequency of the local signal so that the frequency of the baseband signal becomes an arithmetic average of adjacent frequency spectra of the luminance signal.

4. The front-end circuit as set forth in claim 1, wherein:
$\Delta Fstep = \Delta Fh*(a+b)$, where $\Delta Fstep$ is frequency intervals at which the local oscillator circuit is able to oscillate the local signal, $\Delta Fh$ is frequency spectrum intervals of the luminance signal, "a" is a natural number, and "b" is a decimal number.

5. The front-end circuit as set forth in claim 4, wherein:
$\Delta Fstep < \Delta Fh$.

6. The front-end circuit as set forth in claim 5, wherein:
$\Delta Fstep + \Delta DCoffset < \Delta Fh$, where $\Delta DCoffset$ is a frequency bandwidth to be eliminated from the video signal when the DC offset cancel circuit eliminates the DC offset.

7. The front-end circuit as set forth in claim 2, wherein:
$2 \times \Delta Ferror + \Delta DCoffset < \Delta Fh$, where $\Delta Ferror$ is a frequency width corresponding to detection accuracy of the frequency error detected by the frequency error detection circuit, $\Delta DCoffset$ is a frequency bandwidth to be eliminated from the video signal when the DC offset cancel circuit eliminates the DC offset, and $\Delta Fh$ is frequency spectrum intervals of the luminance signal.

8. The front-end circuit as set forth in claim 2, wherein:
$2 \times \Delta Ferror + \Delta Fstep < \Delta Fh$, where $\Delta Ferror$ is a frequency width corresponding to detection accuracy of the frequency error detected by the frequency error detection circuit, $\Delta Fstep$ is frequency intervals at which the local oscillator circuit is able to oscillate the local signal, and $\Delta Fh$ is frequency spectrum intervals of the luminance signal.

9. The front-end circuit as set forth in claim 7, wherein:
$2 \times \Delta Ferror + \Delta DCoffset + \Delta Fstep < \Delta Fh$, where $\Delta Fstep$ is frequency intervals at which the local oscillator circuit is able to oscillate the local signal.

10. The front-end circuit as set forth in claim 2, wherein:
in a case where the frequency error is larger than a predetermined threshold value, the local frequency control circuit switches frequencies of the local signal.

11. The front-end circuit as set forth in claim 10, wherein:
every predetermined period of time, the frequency error detection circuit sends a detection result of a detected frequency error to the local frequency control circuit.

12. The front-end circuit as set forth in claim 1, wherein:
the DC offset cancel circuit detects the DC offset during a vertical blanking interval.

13. The front-end circuit as set forth in claim 10, wherein:
the local frequency control circuit switches the frequencies of the local signal during a vertical blanking interval.

14. The front-end circuit as set forth in claim 2, wherein:
the frequency error detection circuit detects the frequency error of the local signal during a vertical blanking interval.

15. The front-end circuit as set forth in claim 1, wherein:
the local frequency control circuit controls the frequency of the local signal so that the frequency of the baseband signal differs from each of frequency spectra of a color signal contained in the video signal which is generated by demodulating the baseband signal.

16. The front-end circuit as set forth in claim 1, wherein:
the local frequency control circuit controls the frequency of the local signal so that the frequency of the baseband signal differs from each of frequency spectra of an audio signal which is generated by demodulating the baseband signal.

17. A tuner comprising a direct conversion front-end circuit which includes:
- a local oscillator circuit which oscillates a local signal;
- a frequency conversion circuit which carries out a frequency conversion by mixing the local signal and a received signal, the frequency conversion circuit converting the received signal into a baseband signal;
- a DC offset cancel circuit which detects a DC offset contained in the baseband signal and then eliminates the DC offset; and
- a local frequency control circuit which controls a frequency of the local signal,
- in a case where the received signal is an analog television signal, the local frequency control circuit controlling the frequency of the local signal so that a frequency of the baseband signal differs from each of frequency spectra of a luminance signal contained in a video signal which is generated by demodulating the baseband signal.

18. A television broadcasting receiver comprising a tuner which includes a direct conversion front-end circuit including:
- a local oscillator circuit which oscillates a local signal;
- a frequency conversion circuit which carries out a frequency conversion by mixing the local signal and a received signal, the frequency conversion circuit converting the received signal into a baseband signal;
- a DC offset cancel circuit which detects a DC offset contained in the baseband signal and then eliminates the DC offset; and
- a local frequency control circuit which controls a frequency of the local signal,
- in a case where the received signal is an analog television signal, the local frequency control circuit controlling the frequency of the local signal so that a frequency of the baseband signal differs from each of frequency spectra of a luminance signal contained in a video signal which is generated by demodulating the baseband signal.

* * * * *